(12) United States Patent
Hirata

(10) Patent No.: US 11,895,779 B2
(45) Date of Patent: Feb. 6, 2024

(54) SUBSTRATE PROCESSING METHOD

(71) Applicant: SUMITOMO PRECISION PRODUCTS CO., LTD., Amagasaki (JP)

(72) Inventor: Yasuyuki Hirata, Amagasaki (JP)

(73) Assignee: SUMITOMO PRECISION PRODUCTS CO., LTD., Amagasaki (JP)

( * ) Notice: Subject to any disclaimer, the term of this patent is extended or adjusted under 35 U.S.C. 154(b) by 151 days.

(21) Appl. No.: 17/275,371

(22) PCT Filed: Sep. 11, 2019

(86) PCT No.: PCT/JP2019/035766
§ 371 (c)(1),
(2) Date: Mar. 11, 2021

(87) PCT Pub. No.: WO2020/059607
PCT Pub. Date: Mar. 26, 2020

(65) Prior Publication Data
US 2022/0061163 A1   Feb. 24, 2022

(30) Foreign Application Priority Data
Sep. 20, 2018   (JP) .................. 2018-176535

(51) Int. Cl.
*C23C 14/04* (2006.01)
*C23C 14/22* (2006.01)
(Continued)

(52) U.S. Cl.
CPC ......... *H05K 3/1216* (2013.01); *C23C 14/021* (2013.01); *C23C 14/042* (2013.01);
(Continued)

(58) Field of Classification Search
CPC ..... C23C 14/021; C23C 14/04; C23C 14/042; C23C 14/225; C23C 14/34; C23C 16/308; H05K 3/1216
See application file for complete search history.

(56) References Cited

U.S. PATENT DOCUMENTS

| 5,683,937 A | 11/1997 | Furukawa et al. |
| 7,796,267 B2 * | 9/2010 | Saadany ............ G01B 9/02051 356/450 |
| 2007/0128831 A1 | 6/2007 | Oka et al. |

FOREIGN PATENT DOCUMENTS

| JP | H08-172242 A | 7/1996 |
| JP | 2003-053981 A | 2/2003 |

(Continued)

*Primary Examiner* — Nicholas A Smith
*Assistant Examiner* — Patrick S Ott
(74) *Attorney, Agent, or Firm* — Alston & Bird LLP

(57) ABSTRACT

The method for processing a substrate includes the substrate preparation step of preparing the substrate, the pattern formation step of forming dummy patterns extending in an X-direction on the substrate, the mask arrangement step of arranging a stencil mask having multiple opening patterns on the substrate, the coating formation step of forming a metal film on the substrate through the multiple opening patterns, and the separation step of separating the dummy patterns from the substrate to obtain a submount. The dummy pattern has protrusion formed such that a side surface of the submount is exposed and formed close to the side surface with a clearance.

8 Claims, 11 Drawing Sheets

(51) Int. Cl.
*C23C 14/02* (2006.01)
*H05K 3/12* (2006.01)
*C23C 14/34* (2006.01)
*C23C 16/30* (2006.01)

(52) U.S. Cl.
CPC ............ *C23C 14/225* (2013.01); *C23C 14/34* (2013.01); *C23C 16/308* (2013.01)

(56) References Cited

FOREIGN PATENT DOCUMENTS

| | | |
|---|---|---|
| JP | 2005-177974 A | 7/2005 |
| JP | 2015-095590 A | 5/2015 |
| JP | 2017-045952 A | 3/2017 |

* cited by examiner

SUBSTRATE PROCESSING METHOD

CROSS REFERENCE TO RELATED APPLICATIONS

This application is a national stage application, filed under 35 U.S.C. § 371, of International Application No. PCT/JP2019/035766, filed Sep. 11, 2019, which international application claims priority to and the benefit of Japanese (JP) Application No. 2018-176535, filed Sep. 20, 2018; the contents of both of which as are hereby incorporated by reference in their entireties.

BACKGROUND

Technical Field

The present invention relates to a substrate processing method.

Description of Related Art

Typically, a structure in which an electronic device or a micro electro mechanical systems (MEMS) device (hereinafter merely collectively referred to as a device) is mounted on a submount as a support member has been broadly known for ensuring mechanical strength and releasing heat. Moreover, an electrode pattern formed continuously from an upper surface to a side surface of the submount is formed, and electric connection between a mount substrate such as a printed circuit board and the device is made through the electrode pattern.

Japanese Unexamined Patent Publication No. 2003-053981 discloses an electrode pattern formation method in which first sputtering is performed from a predetermined direction for upper and side surfaces of a ceramic base material formed with an ink discharging portion at the side surface and a metal film is patterned after the metal film has been formed by second sputtering from another direction.

Japanese Unexamined Patent Publication No. 2017-045952 discloses a method in which after multiple through-grooves having a predetermined width have been formed in an array at a silicon substrate, a metal film is formed on upper and side surfaces of the substrate. In this method, the substrate is, by dicing, divided into pieces along both ends of each through-groove, and in this manner, a submount is obtained. At both ends of the through-groove, a narrower portion than other portions is formed. At such a portion, no metal film is formed on a groove side surface. With this configuration, burrs and peeling of the metal film upon dicing are prevented.

BRIEF SUMMARY

However, in the typical method described in Japanese Unexamined Patent Publication No. 2003-053981, sputtering and metal film patterning after film formation need to be performed multiple times for forming the electrode pattern, leading to an increase in the number of steps.

In many cases, multiple electrode patterns such as power lines and ground lines are formed separately from each other on a single submount. Moreover, in some cases, coatings separated from each other are formed on a side surface of a submount. However, the typical method described in Japanese Unexamined Patent Publication No. 2017-045952 fails to disclose such a method that the multiple electrode patterns are formed. Particularly, Japanese Unexamined Patent Publication No. 2017-045952 fails to disclose the method for forming the electrodes separated from each other on the side surface of the submount.

The present invention has been made in view of the above-described point, and an object of the present invention is to provide a substrate processing method in which coatings separated from each other can be, by a simple method, formed on a side surface of a body portion obtained by separation of a substrate.

For accomplishing the above-described object, the substrate processing method according to the present invention includes the substrate preparation step of preparing a substrate having an upper surface and a lower surface, the pattern formation step of forming a dummy pattern extending in a first direction on the substrate, the mask arrangement step of arranging a stencil mask having multiple opening patterns on the substrate, the coating formation step of forming a coating on the substrate through the multiple opening patterns, and the separation step of separating the dummy pattern from the substrate to obtain a body portion. The dummy pattern has a protrusion formed such that a side surface of the body portion is exposed and formed close to the side surface of the body portion with a predetermined clearance.

According to such a method, the coating is formed through the opening patterns of the stencil mask on the body portion whose side surface is partially close to the protrusion of the dummy pattern, and therefore, coatings separated from each other can be formed on the side surface of the body portion.

As described above, according to the substrate processing method of the present invention, the coatings separated from each other can be formed on the side surface of the body portion obtained by separation of the substrate.

DETAILED DESCRIPTION OF VARIOUS EMBODIMENTS

Hereinafter, embodiments of the present invention will be described in detail based on the drawings. Description of the preferred embodiments below will be set forth merely as an example in nature and is not intended to limit the present invention and application or use thereof.

First Embodiment

[Configuration of Submount]

Figure 1:
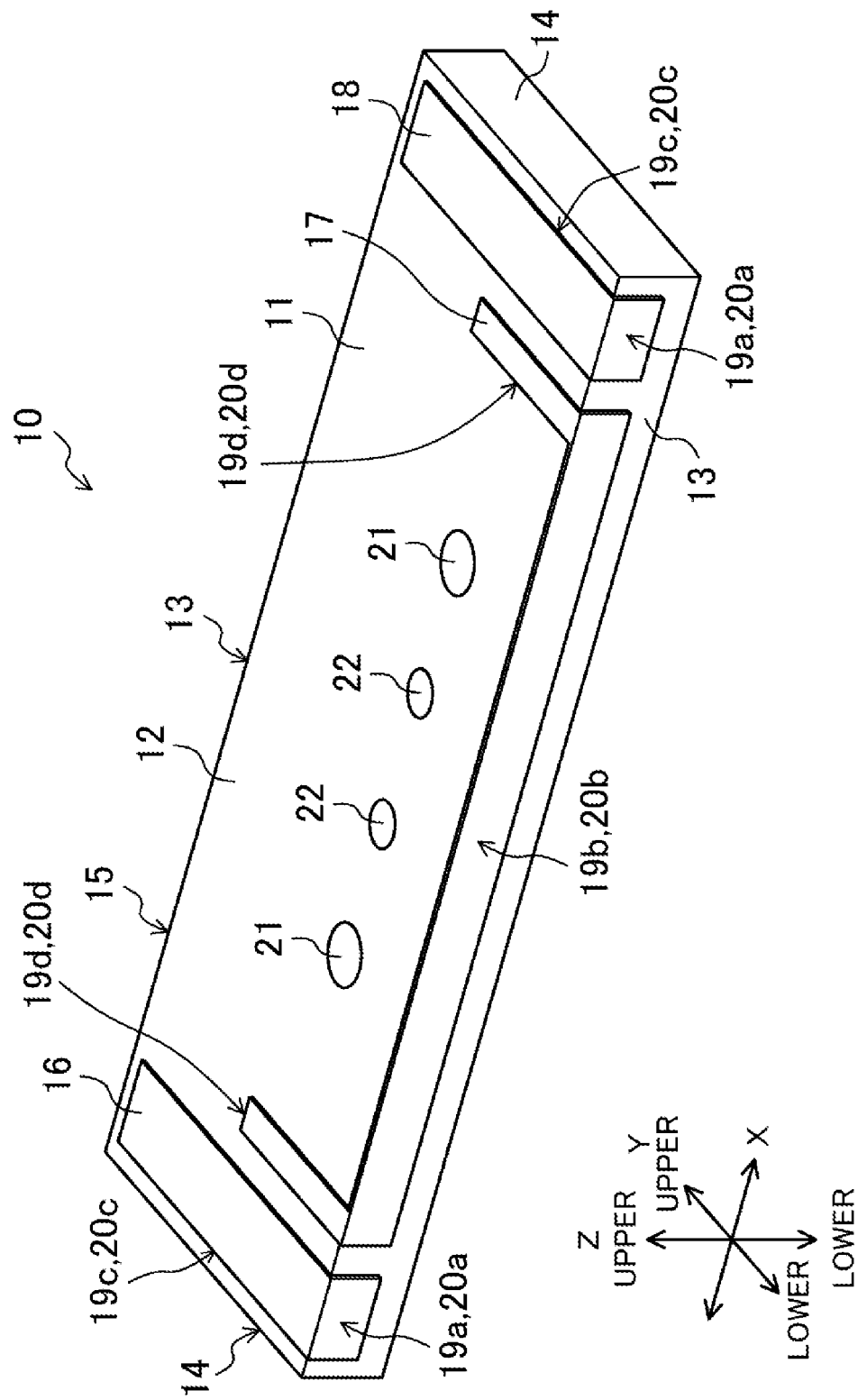
FIG. 1 illustrates a perspective view of a submount according to a first embodiment of the present invention.

FIG. 1 illustrates a perspective view of a submount according to the present embodiment. Note that in description below, surfaces of a base material 11 and a submount 10 through which light passing ports 21, 22 penetrate will be sometimes referred to as an upper surface 12 and a lower surface, one, which is formed with part of first to third electrodes 16 to 18, of four surfaces other than the upper surface 12 and the lower surface will be sometimes referred to as a side surface 13, and surfaces substantially perpendicular to the upper surface 12 and the side surfaces 13 will be sometimes referred to as end surfaces 14. Moreover, a thickness direction of the submount 10 will be sometimes referred to as a Z-direction, the direction of extension of the first electrode 16 and the third electrode 18 on the upper surface 12 of the submount 10 will be sometimes referred to as a Y-direction or a second direction, and a direction perpendicular to the Z-direction and the Y-direction will be sometimes referred to as an X-direction or a first direction. Further, in the Y-direction, a side formed with the second electrode 17 will be sometimes referred to as a lower side, and the opposite side thereof will be sometimes referred to as an upper side.

The submount 10 has the base material 11, an insulating layer 15, the first to third electrodes 16 to 18, and the light passing ports 21, 22, and a not-shown MEMS shutter is mounted on the upper surface 12 of the submount 10 such that the submount 10 functions as part of a shutter apparatus. A wiring pattern formed on a not-shown mount substrate and part of the first to third electrodes 16 to 18 formed on the side surface 13 of the submount 10 are joined to each other, and in this manner, the shutter apparatus stands on the mount substrate and is operated by power supplied from the outside. Specifically, when a predetermined voltage is applied to between the first electrode 16 and the second electrode 17, connection to these electrodes is made, and a shutter (not shown) is moved in an XY plane by a drive mechanism (not shown) configured to drive the shutter, such as an actuator, to open or close an optical path of incident light entering the light passing ports 21 or the light passing ports 22. Similarly, when a predetermined voltage is applied to between the third electrode 18 and the second electrode 17, another shutter (not shown) is moved in the XY plane by another drive mechanism (not shown) to open or close the optical path of incident light entering the light passing ports 21 or the light passing ports 22. Note that in description below, the submount 10 formed with the first to third electrodes 16 to 18 etc. on the base material 11 will be sometimes referred to as a "body portion."

The base material 11 is a substantially rectangular parallelepiped member made of single-crystal silicon and obtained by predetermined processing of a later-described single-crystal silicon substrate 100 (hereinafter merely referred to as a substrate 100). Moreover, the insulating layer 15 including a thermally-oxidized film is formed on the surface of the base material 11. Further, the first to third electrodes 16 to 18 are formed on the surface of the insulating layer 15. The first to third electrodes 16 to 18 are formed separately from each other, and any of the first to third electrodes 16 to 18 is formed continuously from the upper surface 12 to the side surface 13 of the submount 10. Each of the first to third electrodes 16 to 18 includes a metal film multilayer structure such as an Au/Ti film. Moreover, the light passing ports 21, 22 are formed to penetrate the submount 10 in the Z-direction, and are provided at predetermined intervals.

Note that in description below, regions of the first and third electrodes 16, 18 formed on the side surface 13 of the submount 10 will be sometimes referred to as first coated regions 19a, and a region of the second electrode 17 formed on the side surface 13 of the submount 10 will be sometimes referred to as a second coated region 19b. Moreover, regions of the first and third electrodes 16, 18 formed on the upper surface 12 of the submount 10 will be sometimes referred to as third coated regions 19c, and regions of the second electrode 17 formed on the upper surface 12 of the submount 10 will be sometimes referred to as fourth coated regions 19d. Further, regions where the first and third electrodes 16, 18 are to be formed on the side surface 13 of the submount 10 will be sometimes referred to as first coating preformation regions 20a, and a region where the second electrode 17 is to be formed on the side surface 13 of the submount 10 will be sometime collectively referred to as a second coating preformation region 20b. In addition, regions where the first and third electrodes 16, 18 are to be formed on the upper surface 12 of the submount 10 will be sometimes referred to as third coating preformation regions 20c, and regions where the second electrode 17 is to be formed on the upper surface 12 of the submount 10 will be sometimes referred to as fourth coating preformation regions 20d.

Note that in the present embodiment, the length of the submount 10 in the X-direction is 60 mm, the length of the submount 10 in the Y-direction is 50 mm, and the thickness of the submount 10 in the Z-direction is 500 µm, but the present invention is not particularly limited to above. Moreover, the width of the second electrode 17, which is formed on the upper surface 12 of the submount 10, in the X-direction is 200 µm and an interval between the first electrode 16 and the second electrode 17 and an interval between the second electrode 17 and the third electrode 18 on the upper surface 12 of the submount 10 are 200 µm, but the present invention is not particularly limited to above. Any of these values may be changed as necessary according to, e.g., the size of the shutter apparatus. Further, the diameter of the light passing port 21 is 400 µm and the diameter of the light passing port 22 is a value slightly smaller than the diameter of the light passing port 21, such as 250 µm, but these values may be changed as necessary according to an incident light optical path size.

[Configurations of Substrate and Stencil Mask during Processing]

Figure 2:
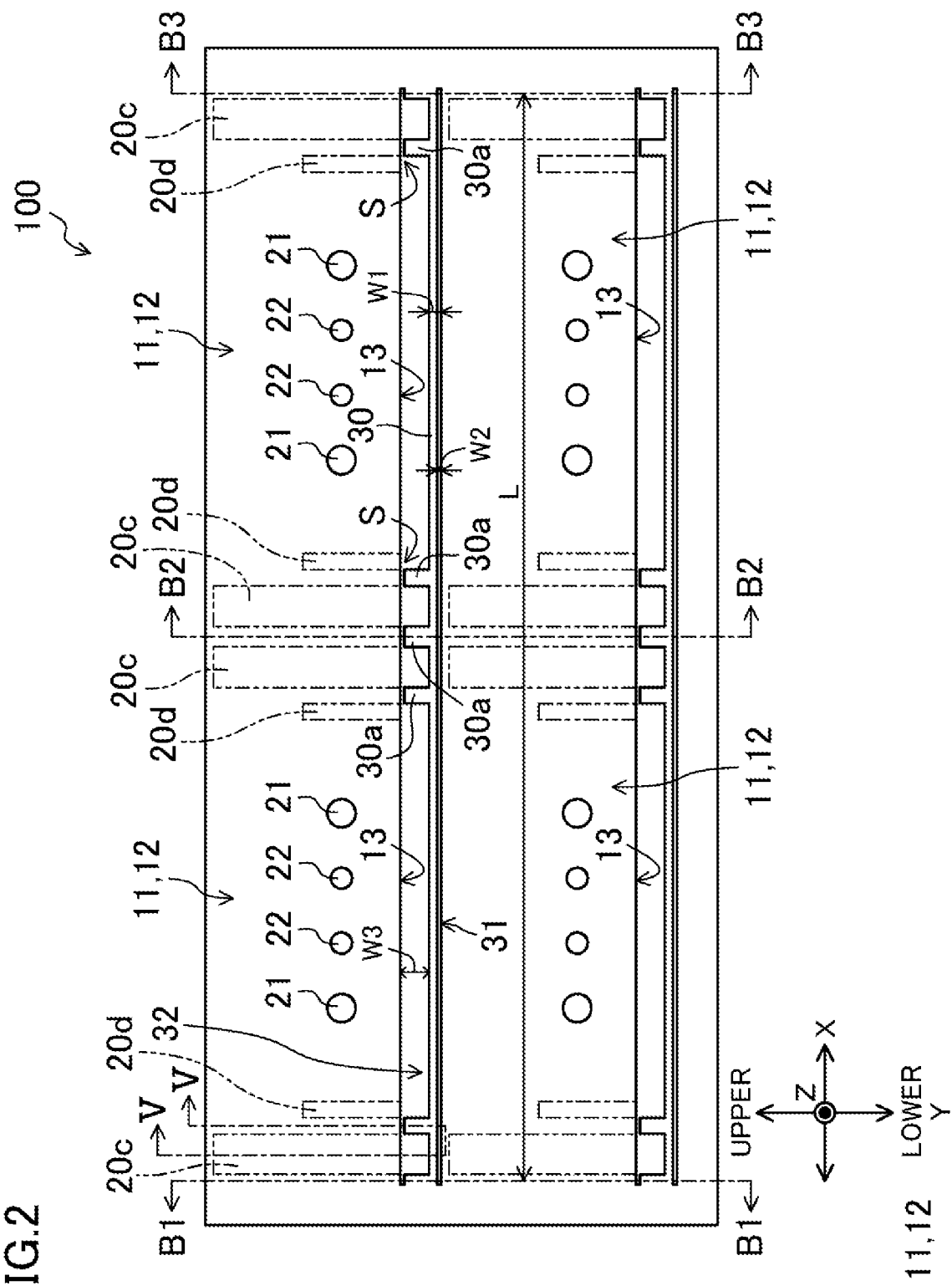
FIG. 2 illustrates a partially-enlarged plan view of a substrate during processing.
Figure 3:
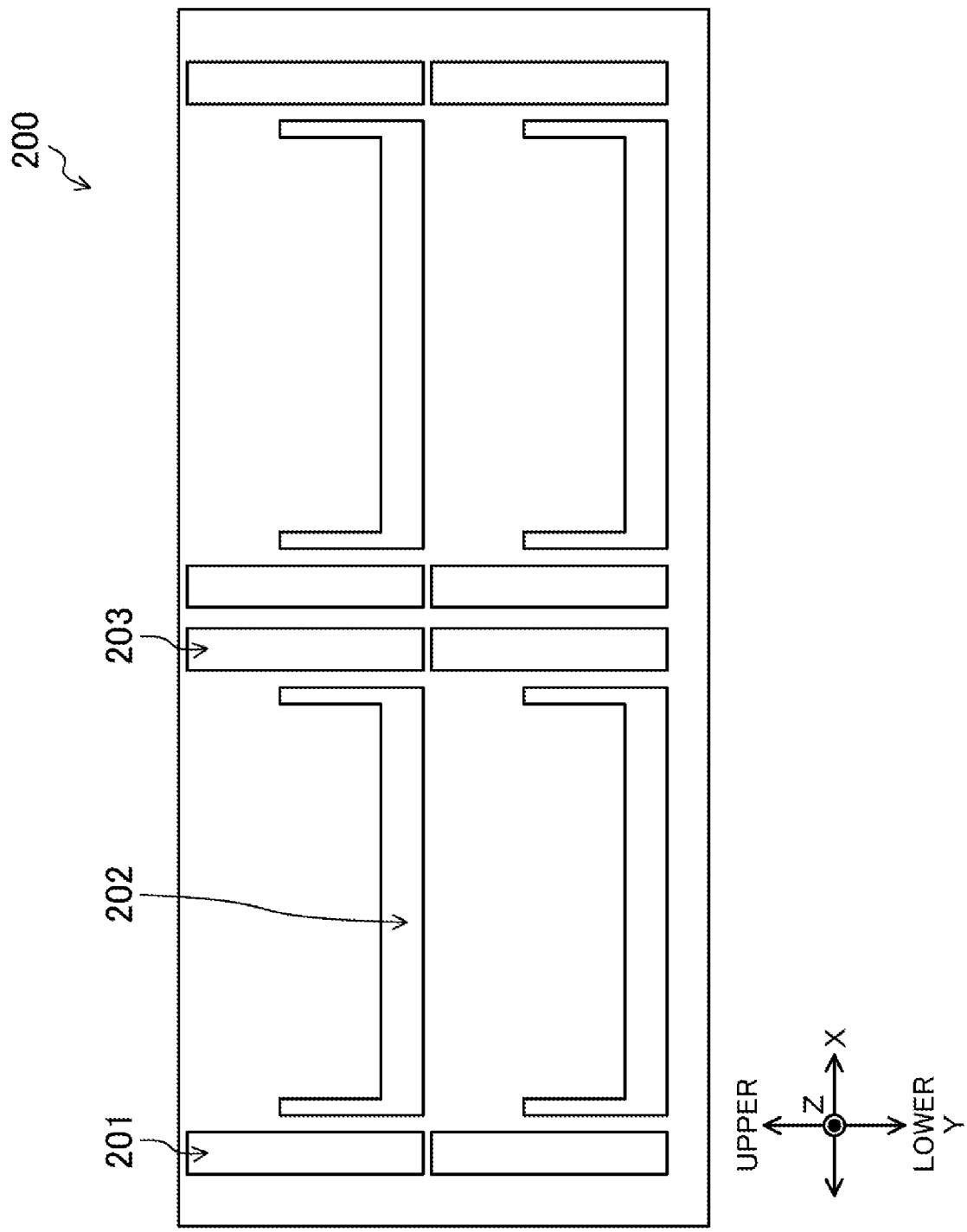
FIG. 3 illustrates a plan view of a stencil mask.
Figure 4:
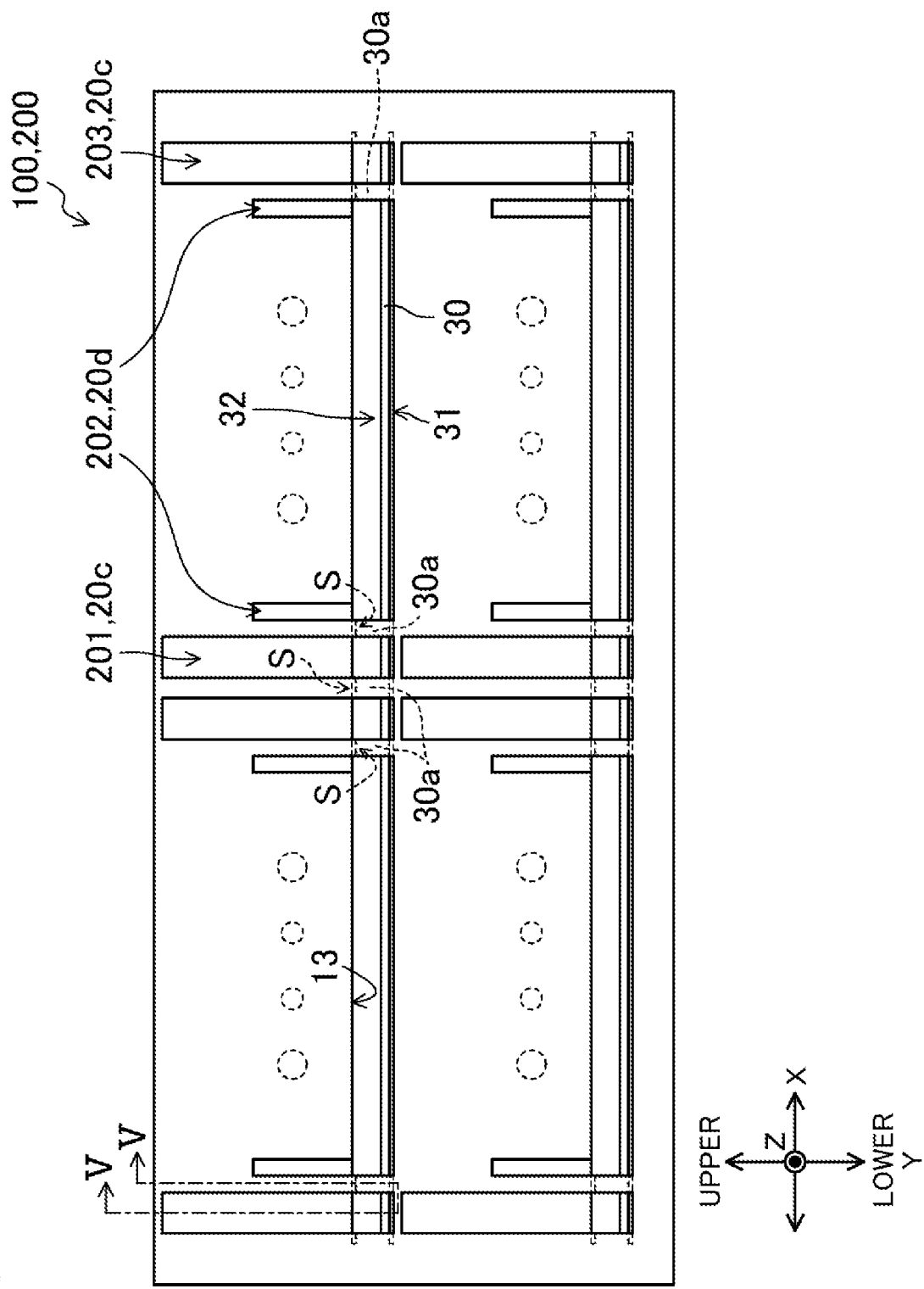
FIG. 4 illustrates a plan view when the substrate and the stencil mask are stacked on each other.

FIG. 2 illustrates a partially-enlarged plan view of the substrate during processing, FIG. 3 illustrates a plan view of a stencil mask, and FIG. 4 illustrates a plan view when the substrate illustrated in FIG. 2 and the stencil mask illustrated in FIG. 3 are stacked on each other. FIG. 2 corresponds to a shape right after a later-described pattern formation step (see FIG. 5(a)). Note that the X to Z directions in FIGS. 2 to 4 are the same as the X to Z directions illustrated in FIG. 1.

As illustrated in FIG. 2, dummy patterns 30 are formed in a matrix at predetermined intervals in the X-direction and the Y-direction on the substrate 100. Note that portions surrounded by dashed lines indicate the third coating preformation regions 20c and the fourth coating preformation regions 20d as described above.

The dummy pattern 30 is a rod-shaped member extending in the X-direction and sandwiched between first and second grooves 31, 32 in the Y-direction, the first groove 31 being formed on the lower side in the Y-direction and the second groove 32 being formed on the upper side in the Y-direction. The length of the dummy pattern 30 in the X-direction is substantially equal to a value L longer than the length (=60 mm) of the above-described submount in the X-direction by about several μm to several mm, and the width W1 of the dummy pattern 30 in the Y-direction is about several tens of μm. Moreover, the thickness of the dummy pattern 30 in the Z-direction is equal to the thickness of the substrate 100. Note that the width W1 is not particularly limited to above, and a different value may be taken. The dummy pattern 30 has multiple protrusions 30a provided at intervals in the X-direction and extending in the Y-direction. As viewed in plane, the side surface of the base material 11, i.e., the side surface 13 of the submount 10, is exposed at a tip end of the protrusion 30a, and the tip end of the protrusion 30a is close to the side surface 13 through a predetermined clearance S. Moreover, the width of the clearance S in the Y-direction is about several μm to several tens of μm. Further, the protrusion 30a is, as viewed in plane, provided to extend in the Y-direction in the second groove 32.

The protrusion 30a is formed such that the width thereof in the X-direction is equal to the interval between the first electrode 16 and the second electrode 17 and the interval between the second electrode 17 and the third electrode 18 on the upper surface 12 and the side surface 13 of the submount 10. Moreover, both ends of the dummy pattern 30 in the X-direction are connected to the substrate 100 in the X-direction.

The first groove 31 is formed to penetrate the substrate 100 in the Z-direction, the length of the first groove 31 in the X-direction is equal to the above-described length L, and the width of the first groove 31 in the Y-direction is W2. The width W2 is equal to or slightly greater than the width of the clearance S in the Y-direction. As in the first groove 31, the second groove 32 is formed to penetrate the substrate 100 in the Z-direction, and the length of the second groove 32 in the X-direction is equal to the above-described length L. The width W3 of part, which does not overlap with the protrusion 30a as viewed in plane, of the second groove 32 in the Y-direction is about 100 μm to hundreds of μm.

Virtual lines B1-B1, B2-B2, B3-B3 illustrated in FIG. 2 each correspond to later-described dividing lines of the substrate 100 (hereinafter referred to as dividing lines B1-B1, B2-B2, B3-B3). The dividing lines B1-B1, B2-B2, B3-B3 extend in the Y-direction. Moreover, the dividing lines B1-B1, B3-B3 are set to pass through both ends of the dummy pattern 30.

A stencil mask 200 is a mask used at a later-described coating formation step (see FIG. 5(c)), and a metal film 40 (see FIG. 5(c)) is formed on the substrate 100 through opening patterns of the stencil mask 200. As illustrated in FIG. 3, first to third opening patterns 201 to 203 are provided in a matrix at the stencil mask 200, and the pitches of each opening pattern in the X-direction and the Y-direction are equal to the pitches of the dummy pattern 30 in the X-direction and the Y-direction.

As illustrated in FIG. 4, when the stencil mask 200 is arranged on the substrate 100 after having been aligned with the substrate 100, the stencil mask 200 is arranged on the substrate 100 to cover the clearances S. Specifically, the stencil mask 200 is, as viewed in plane, arranged to continuously cover the protrusions 30a, the clearances S, and the base material 11 as the component of the submount 10 facing the protrusions 30a. The first and third opening patterns 201, 203 are, as viewed in plane, arranged to cross the dummy patterns 30 in the Y-direction and overlap with the third coating preformation regions 20c. As described later, the first electrode 16 is formed on the submount 10 through the first opening patterns 201, and the third electrode 18 is formed on the submount 10 through the third opening patterns 203. Similarly, the second opening patterns 202 are, as viewed in plane, arranged to cross the dummy patterns 30 in the Y-direction and overlap with the fourth coating preformation regions 20d. The second electrode 17 is formed on the submount 10 through the second opening patterns 202.

[Steps of Manufacturing Submount]

Figure 5:
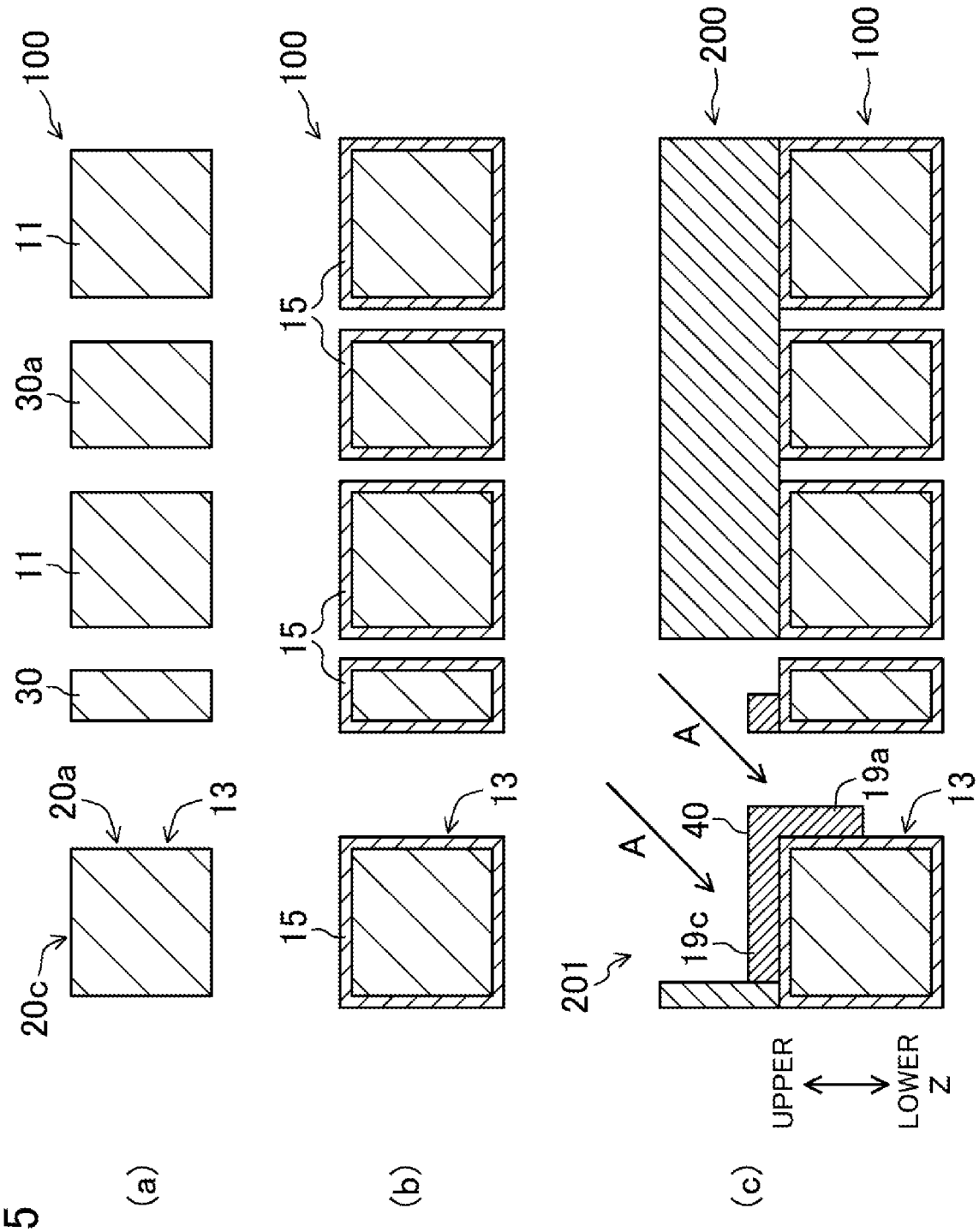
FIG. 5 illustrates views for describing the steps of manufacturing the submount.

FIG. 5 illustrates the steps of manufacturing the submount according to the present embodiment. Note that FIG. 5 corresponds to sectional views along a V-V line of FIGS. 2 and 4.

First, the substrate 100 made of the single-crystal silicon and having the upper surface and the lower surface facing thereto is prepared (a substrate preparation step), and after a not-shown mask pattern has been formed on the upper surface of the substrate 100, the substrate 100 is etched in the Z-direction by means of the mask pattern. The mask pattern is removed, and as illustrated in FIG. 5(a), the dummy patterns 30 are formed on the substrate 100 (the pattern formation step). Although not shown in the figure, the light passing ports 21, 22 are also simultaneously formed at this step. Moreover, at the pattern formation step, the dummy patterns 30 are formed such that the side surface 13 and the first and second coating preformation regions 20a, 20b of the submount 10 are exposed. Specifically, the first grooves 31 and the second grooves 32 penetrating the substrate 100 are formed such that the dummy patterns 30 remain, and in this manner, the side surface 13 of the base material 11 as the component of the submount 10 is exposed. A deep reactive ion etching (DRIE) method is used as the method for etching the substrate 100. Note that another method such as laser drilling may be used.

Next, the substrate 100 on which the dummy patterns 30 are formed is thermally oxidized, and as illustrated in FIG. 5(b), the insulating layer 15 including the thermally-oxidized film is formed on the surface of the substrate 100 including the side surfaces 13 of the base material 11 (an insulating layer formation step). The thickness of the insulating layer 15 is about 0.5 μm to 1.0 μm.

Using a not-shown alignment mark formed on the substrate 100, the stencil mask 200 is aligned with the substrate 100, and thereafter, is arranged on the substrate 100 (a mask arrangement step). At this point, the stencil mask 200 is, as viewed in plane, arranged on the substrate 100 to continuously cover the protrusions 30a, the clearances S, and the base material 11 facing the protrusions 30a (see FIG. 4). At the mask arrangement step, the stencil mask 200 may contact the substrate 100. When the stencil mask 200 is, with a distance from the substrate 100, arranged above the substrate 100 in the Z-direction, such a distance is preferably equal to or smaller than several tens of μm. Further, as illustrated in FIG. 5(c), the metal film 40 is formed on the substrate 100 in a state in which the stencil mask 200 is arranged (the coating formation step). At this point, the metal film 40 is formed such that metal particles forming the metal film 40 come from a direction inclined at a predetermined angle with respect to the upper surface of the substrate 100, such as a direction (see a direction A in FIG. 5(c)) inclined at 45° with respect to the upper surface in this case. For example, a well-known oblique incidence sputtering method can be used as the method for vapor-depositing the metal film 40. Note that in the present embodiment, the metal film 40 is formed as the coating, but according to, e.g., use of the submount 10, a metal oxide, a dielectric film, an insulating film, etc. can be used other than the metal film 40.

At the coating formation step, the metal film 40 is formed on the first to fourth coating preformation regions 20a to 20d through the first to third opening patterns 201 to 203. On the other hand, the metal film 40 is not formed on part of the side surface 13 of the submount 10 where the clearance S is formed between the side surface 13 and each protrusion 30a. This is because the stencil mask 200 is arranged to cover the clearances S as illustrated in FIG. 4. This is also because the clearance S has a narrow width of equal to or smaller than several μm to several tens of μm and the metal particles are less likely to enter the clearance S even in a case where a metal particle incoming direction has changed. The metal film 40 is formed on neither the upper side surface 13 of the submount 10 in the Y-direction nor the side surface of the dummy pattern 30. This is because these side surfaces are hidden as viewed from the metal particles coming from the direction A and the metal film 40 is less likely to be formed. The width W1 of the first groove 31 in the Y-direction is substantially the same as the clearance S, and therefore, the metal particles are less likely to enter the first groove 31. Thus, the metal film 40 is not formed on the upper side surface 13 of the submount 10 in the Y-direction.

After the stencil mask 200 has been removed, the substrate 100 is divided in the Y-direction along the dividing lines B1-B1, B2-B2, B3-B3 illustrated in FIG. 2. In this manner, the dummy patterns 30 are separated from the substrate 100. Through the pattern formation step and the coating formation step, the substrate 100 is divided into pieces such that the side surfaces 13 and the end surfaces 14 of the submount 10 are exposed, and the submount 10 is obtained (a separation step). Note that in the present embodiment, so-called stealth dicing for irradiating the submount 10 with a predetermined laser light output while the substrate 100 is being scanned with laser light along a division direction is used for dividing the substrate 100. Thus, part of the upper surface of the substrate 100 where the dividing lines B1-B1, B2-B2, B3-B3 are positioned needs to be covered with the stencil mask 200 such that the metal film 40 is not formed on such part.

[Advantageous Effects etc.]

As described above, the method for processing the substrate 100 according to the present embodiment includes the substrate preparation step of preparing the substrate 100 having the upper surface and the lower surface, the pattern formation step of forming the dummy patterns 30 extending in the X-direction (the first direction) on the substrate 100, the mask arrangement step of arranging the stencil mask 200 having the multiple opening patterns 201 to 203 on the substrate 100, the coating formation step of forming the metal film 40 as the coating on the substrate 100 through the multiple opening patterns 201 to 203, and the separation step of separating the dummy patterns 30 from the substrate 100 to obtain the submount 10 as the body portion. The dummy pattern 30 has the protrusions 30a provided such that the side surface 13 of the submount 10 is exposed and provided close to the side surface 13 of the submount 10 with the predetermined clearance.

According to the present embodiment, the above-described protrusions 30a are provided at the dummy pattern 30, and therefore, formation of the metal film 40 on the side surface 13 of the submount 10 facing the protrusions 30a can be prevented. Thus, the metal film 40 can be partially formed on the side surface 13 of the submount 10.

The stencil mask 200 is arranged on the substrate 100 to cover at least the clearances S. Thus, formation of the metal film 40 on the side surface 13 of the submount 10 facing the protrusions 30a can be reliably prevented. Moreover, the stencil mask 200 is arranged on the substrate 100 to continuously cover at least the protrusions 30a, the clearances S, and the submount 10 facing the protrusions 30a. Thus, as viewed in plane, the metal film 40 can be partially formed on both of the upper surface 12 and the side surface 13 of the submount 10 facing the protrusions 30a.

The first coated regions 19a and the second coated region 19b are formed on both sides of the side surface 13 of the submount 10 facing the protrusions 30a. Thus, on the side surface 13 of the submount 10, the first coated regions 19a and the second coated region 19b can be formed separately from each other, and an interval between the first coated region 19a and the second coated region 19b can be the width of the protrusion 30a in the X-direction. Consequently, such an interval can be easily set. Moreover, on the upper surface 12 of the submount 10, the third coated regions 19c formed continuously to the first coated regions 19a and extending in the Y-direction (the second direction) and the fourth coated regions 19d formed continuously to the second coated region 19b and extending in the Y-direction are formed. Thus, the coatings separated from each other can be formed continuously from the upper surface 12 to the side surface 13 of the submount 10. An interval between these coatings can be the width of the protrusion 30a in the X-direction, and therefore, can be easily set.

The dummy pattern 30 is connected to the substrate 100 only on end sides of the submount 10 in the X-direction. Thus, at the separation step, the substrate 100 is divided only in one direction, the Y-direction in this case, along both ends of the dummy pattern 30. In this manner, the substrate 100 can be easily divided into pieces, and the submount 10 can be obtained. Moreover, the number of steps of the processing for dividing the substrate 100 into pieces and the cost of such processing can be reduced.

The method for processing the substrate 100 as described in the present embodiment is also the method for manufacturing the submount 10. According to the present embodiment, the electrodes separated from each other at predetermined intervals can be formed on the side surface 13 of the submount 10. Moreover, the multiple electrodes separated from each other at the predetermined intervals and formed continuously from the upper surface 12 to the side surface 13 of the submount 10 can be formed.

For example, in a case where the side surface 13 of the submount 10 formed with the electrodes contact the wiring pattern of the mount substrate and the submount 10 is arranged on the mount substrate, these components can be electrically connected to each other. Thus, a mount area of the submount 10, on which a device is mounted, on the mount substrate can be reduced, and the device can be electrically driven.

According to the present embodiment, the width of the protrusion 30a and the width of the stencil mask 200 covering the protrusions 30a are properly set so that short circuit and leakage between the electrodes can be prevented and favorable characteristics and reliability of the device mounted on the submount 10 can be maintained.

According to the present embodiment, the multiple electrodes formed continuously from the upper surface 12 to the side surface 13 of the submount 10 can be formed separately from each other by the single mask arrangement step and the single metal film formation step. Thus, as compared to, e.g., the typical method disclosed in Patent Document 1, the number of steps can be reduced, and the cost for manufacturing the submount 10 can be reduced.

At the coating formation step, the metal film 40 is formed using the metal particles coming from the direction inclined at the predetermined angle with respect to the upper surface of the substrate 100. Thus, the metal film 40 can be easily formed on the side surface 13 of the submount 10. Moreover, a film thickness difference from the metal film 40 formed on the upper surface 12 of the submount 10 can be decreased, and the electric resistance of the first to third electrodes 16 to 18 can be decreased. Further, e.g., disconnection of the first to third electrodes 16 to 18 can be prevented.

The clearance S between the protrusion 30*a* and the side surface 13 of the submount 10 is properly set so that the coatings separated from each other can be more reliably formed on the side surface 13 of the submount 10. In the present embodiment, the oblique incidence sputtering method is used as the method for forming the metal film 40. Normally in this method, in a state in which the normal line of a target surface is inclined at a predetermined angle with respect to the normal line of the substrate 100, sputtering is performed while the substrate 100 or a target is being rotated about the normal line. Thus, even when the clearances S are covered with the stencil mask 200 as illustrated in, e.g., FIG. 4, the metal film 40 might be formed around the side surface 13 of the submount 10 facing the protrusions 30*a*. Due to such a phenomenon, short circuit or leakage between the electrodes might be caused at the submount 10, leading to a characteristic defect of the device mounted on the submount 10. In an extreme case, damage of the device might be caused.

On the other hand, the clearance S is set to equal to or smaller than several m to several tens of μm so that formation of the metal film 40 between the first electrode 16 and the second electrode 17 and between the second electrode 17 and the third electrode 18 can be reliably prevented. Thus, short circuit and leakage between the electrodes can be prevented, and favorable characteristics and reliability of the device mounted on the submount 10 can be maintained.

Note that as described in the present embodiment, the DRIE is used at the pattern formation step so that asperities of the side surface 13 of the submount 10 can be equal to or smaller than a predetermined value. Thus, a defect such as unevenness of the metal film 40 due to the asperities or failure to partially form the metal film 40 can be eliminated. Thus, disconnection of the first to third electrodes 16 to 18 can be reduced and an increase in the resistance of the first to third electrodes 16 to 18 can be suppressed, and therefore, favorable characteristics and reliability of the device mounted on the submount 10 can be maintained.

Figure 6:
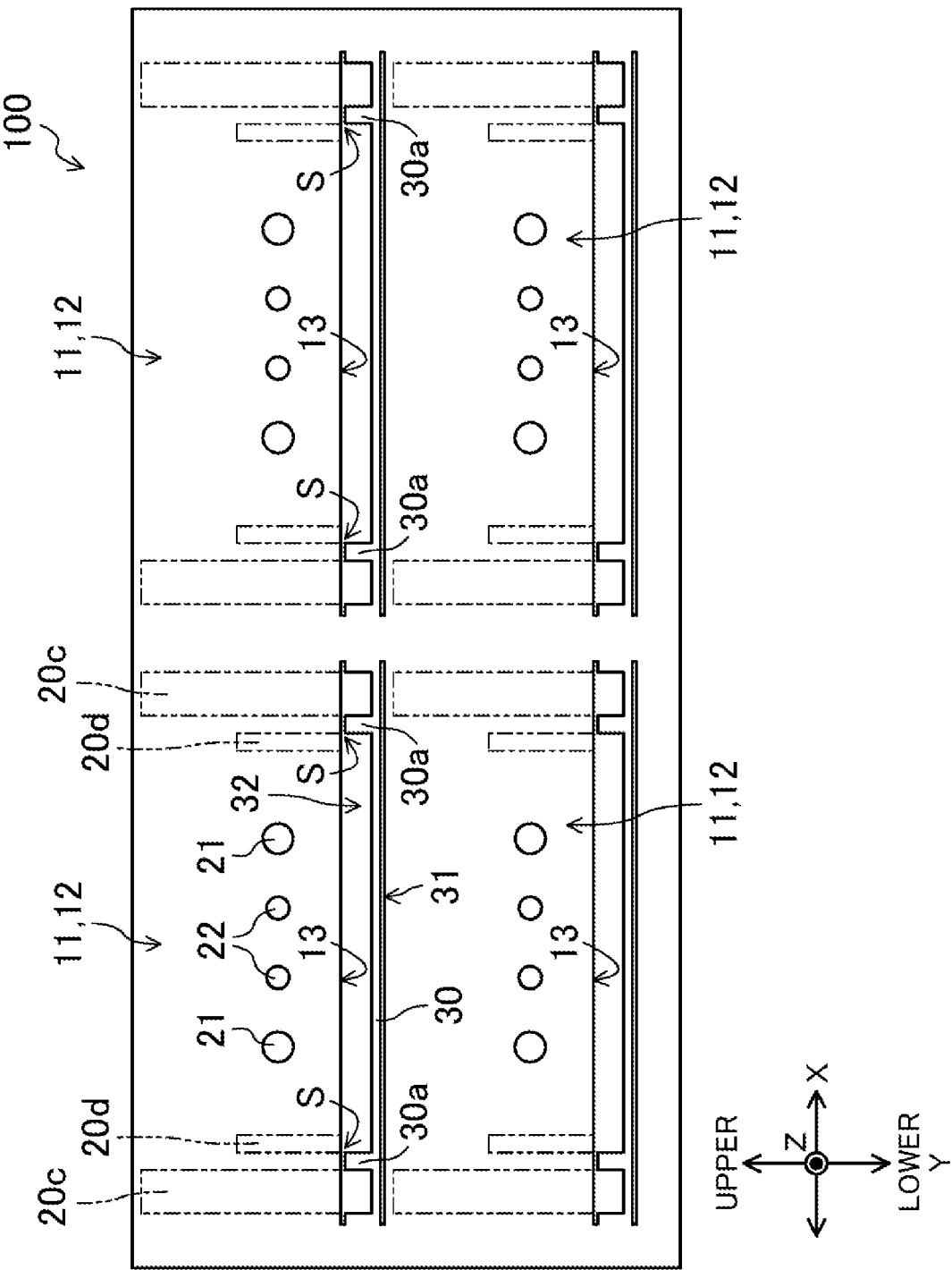
FIG. 6 illustrates a partially-enlarged plan view of the substrate during processing.

Note that the shape of the dummy pattern 30 may be changed as necessary according to, e.g., the specifications of the submount 10. For example, the single dummy pattern 30 may be formed for two submounts 10 continuously formed in the X-direction as illustrated in FIG. 2, or the single dummy pattern 30 may be formed for the single submount 10 as illustrated in FIG. 6.

<Variation>

Figure 7:
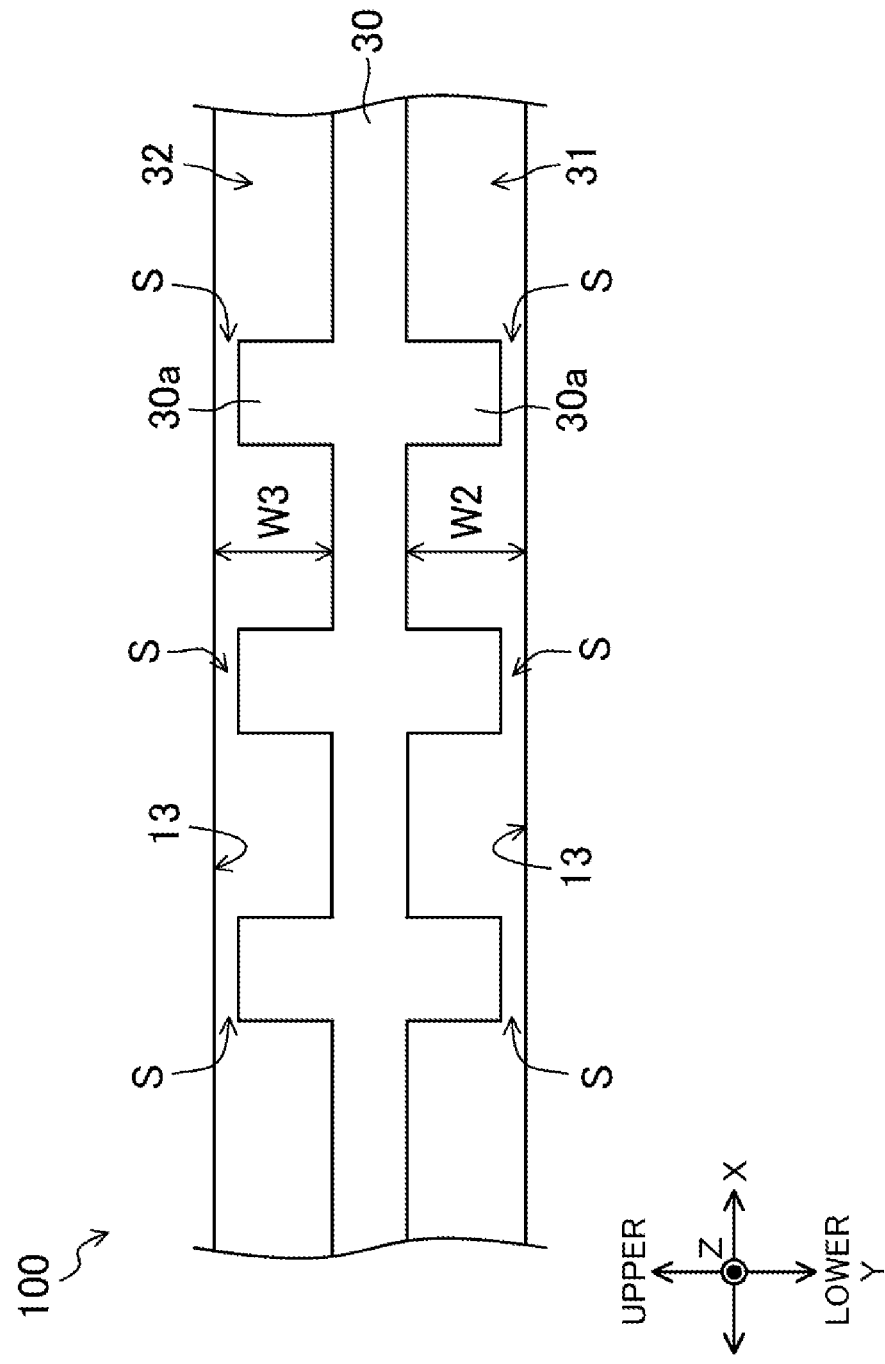
FIG. 7 illustrates a partially-enlarged plan view of a substrate during processing according to a variation.

FIG. 7 illustrates a partially-enlarged plan view of a substrate during processing according to the present variation. The same reference numerals are, in FIG. 7, used to represent elements similar to those of the first embodiment, and detailed description thereof will be omitted.

The configuration of the substrate 100 of the present variation and the configuration of the substrate 100 of the first embodiment are different from each other in that the width W2 of the first groove 31 and the width W3 of the second groove 32 are substantially the same as each other and the protrusions 30*a* formed at the dummy pattern 30 also extend downwardly in the Y-direction. Note that a clearance between the protrusion 30*a* extending downwardly in the Y-direction and the side surface 13 of the submount 10 is the same dimension as that of the above-described clearance S.

The substrate 100 is processed into such a shape, and therefore, the metal film 40 can be also formed on the side surface of the submount 10 of FIG. 1 facing the side surface 13 on which the first and second coated regions 19*a*, 19*b* are formed. Depending on the form of mounting of the submount 10, the electrodes may be formed on each of the opposing side surfaces 13 in some cases. Using the above-described oblique incidence sputtering method, the metal film 40 can be, according to rotation of the substrate 100, formed on each of the opposing side surfaces 13 of the submount 10 illustrated in FIG. 1 by a single sputtering, for example. That is, the electrodes can be formed on each of the opposing side surfaces 13 of the submount 10 without the need for increasing the step of forming the metal film 40.

Second Embodiment

Figure 8:
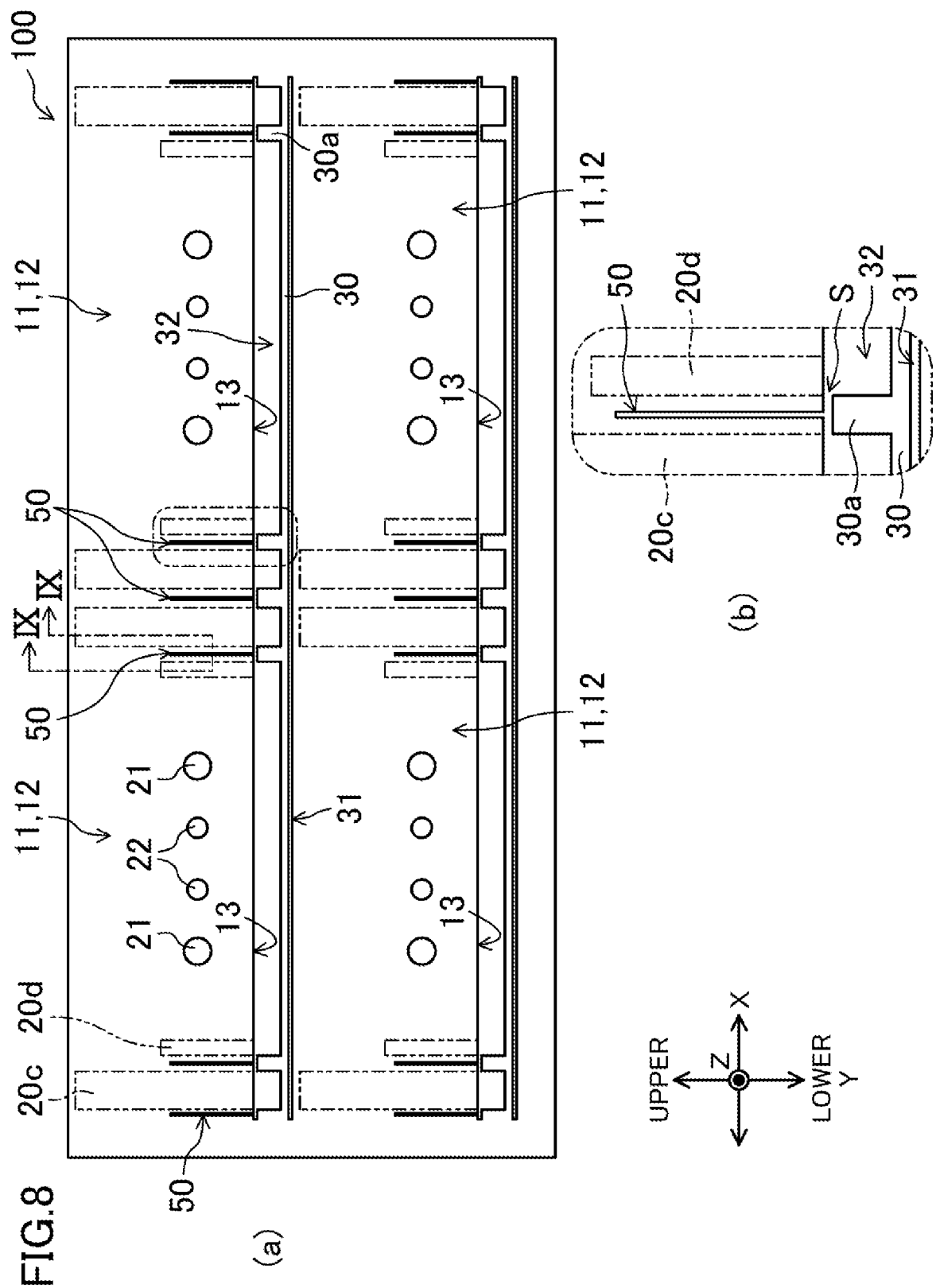
FIG. 8 illustrates partially-enlarged plan views of a substrate during processing according to a second embodiment of the present invention.
Figure 9:
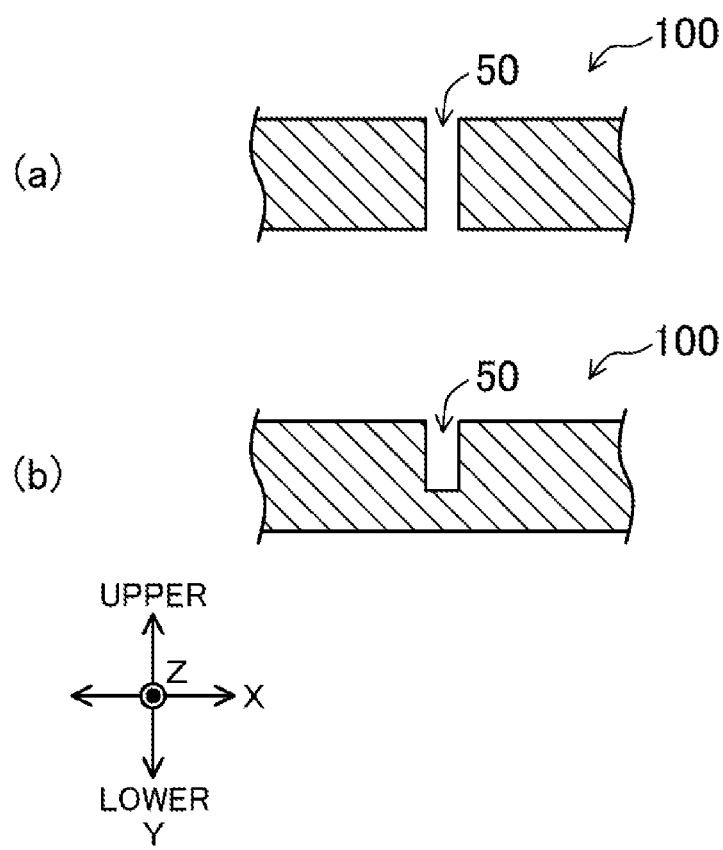
FIG. 9 illustrates schematic sectional views along an IX-IX line of FIG. 8.

FIG. 8 illustrates partially-enlarged plan views of a substrate during processing according to the present embodiment, and FIG. 9 illustrates sectional views along an IX-IX line of FIG. 8. Note that in FIGS. 8 and 9, the same reference numerals are used to represent elements similar to those of the first embodiment, and detailed description thereof will be omitted.

A configuration of a substrate 100 described in the present embodiment and the configuration of the substrate 100 described in the first embodiment are different from each other in that third grooves 50 are each formed between a first coating preformation region 20*a* and a second coating preformation region 20*b*, between a third coating preformation region 20*c* and a fourth coating preformation region 20*d*, between the first coating preformation region 20*a* and an end surface 14 of a submount 10, and between the third coating preformation region 20*c* and the end surface 14 of the submount 10. The width of the third groove 50 in the X-direction is about several μm to several tens of and the length of the third groove 50 in the Y-direction is about several μm to several mm. Moreover, one end of the third groove 50 reaches a side surface 13 of the submount 10. Further, although not shown in the figure, an insulating layer 15 is formed on a side surface of the third groove 50.

As described above, in some cases, the side surface 13 of the submount 10 contacts a not-shown mount substrate, and the submount 10 and a device mounted thereon stand on the mount substrate. In this case, a wiring pattern on the mount substrate and electrodes provided on the side surface 13 of the submount 10 are joined to each other through a conductive adhesive such as solder. However, for ensuring bonding strength, the submount 10 is mounted on the mount substrate while being pressed with a predetermined pressure, and for this reason, the conductive adhesive might protrude from a predetermined position to the outside. Due to such protrusion, short circuit or leakage between the electrodes might be caused.

On the other hand, according to the present embodiment, the third grooves 50 are provided at the above-described positions, and absorb the protruding conductive adhesive. Thus, short circuit and leakage between the electrodes can be prevented, and favorable characteristics and reliability of the device can be maintained. As illustrated in FIG. 9(*a*), the third grooves 50 penetrate the substrate 100 so that dummy patterns 30 and the third grooves 50 can be simultaneously formed at the pattern formation step illustrated in FIG. 5. Thus, an increase in the number of steps can be prevented, and an increase in the cost for manufacturing the submount 10 can be suppressed. Note that as illustrated in FIG. 9(b), the substrate 100 may be etched to the middle in the Z-direction, thereby forming the third grooves 50.

Note that FIG. 8 illustrates the example where the single third groove 50 is formed at each of the above-described positions, but with an extra space, multiple third grooves 50 may be provided at intervals. With this configuration, the conductive adhesive joined to the first electrode 16 and the conductive adhesive joined to the second electrode 17 can be, for example, separated from each other and be absorbed by the third grooves 50. Thus, short circuit and leakage between the electrodes can be more reliably prevented. Note that for ensuring the strength of the submount 10, the length of the third groove 50 in the Y-direction is preferably equal to or smaller than the half of the length of the submount 10 in the Y-direction.

Third Embodiment

Figure 10:
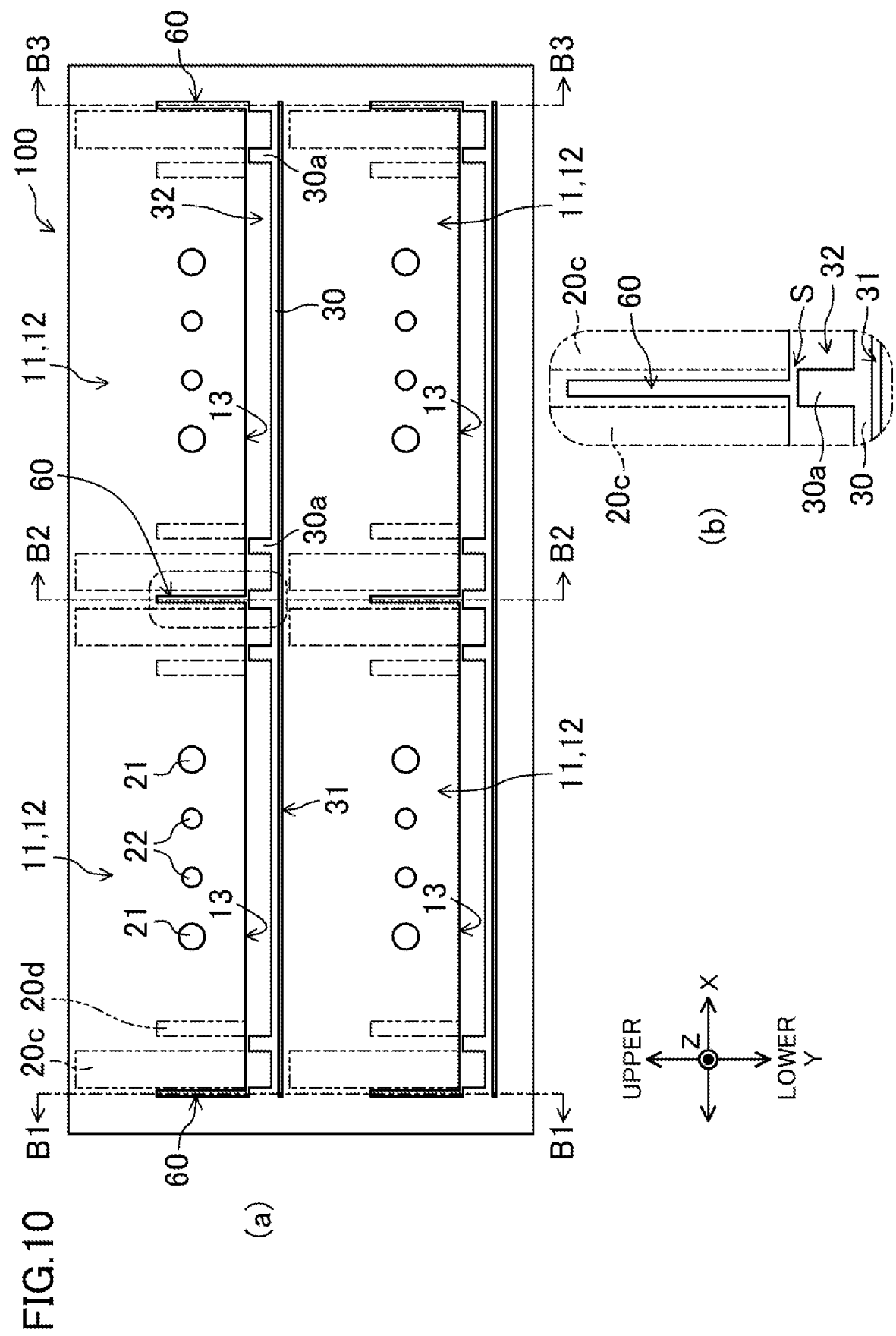
FIG. 10 illustrates partially-enlarged plan views of a substrate during processing according to a third embodiment of the present invention.

FIG. 10 illustrates partially-enlarged plan views of a substrate during processing according to the present embodiment. Note that in FIG. 10, the same reference numerals are used to represent elements similar to those of the first embodiment, and detailed description thereof will be omitted.

A configuration of a substrate 100 described in the present embodiment and the configuration of the substrate 100 described in the first embodiment are different from each other in that a fourth groove 60 is formed between submounts 10 adjacent to each other in the X-direction, i.e., formed such that an end surface 14 formed continuously to a side surface 13 of the submount 10 is exposed. The fourth groove 60 penetrates the substrate 100, the width of the fourth groove 60 in the X-direction is about 100 μm to 200 μm, and the length of the fourth groove 60 in the Y-direction is about 20 mm. Moreover, one end of the fourth groove 60 reaches the side surface 13 of the submount 10. Further, although not shown in the figure, an insulating layer 15 is formed on a side surface of the fourth groove 60, i.e., part of the end surface 14 of the submount 10.

The substrate 100 normally contains a predetermined amount of n-type or p-type impurity, and therefore, has a predetermined resistance such as a resistance of zero point several Ω·cm to several tens of Ω·cm. The insulating layer 15 is formed on the surface of the substrate 100 through the insulating layer formation step illustrated in FIG. 5, and when the substrate 100 is divided into pieces, the substrate 100 itself is exposed at the end surface 14 of the submount 10. For this reason, a conductive adhesive protrudes, for example, from a first coated region 19a of a first electrode 16 formed on the side surface 13 of the submount 10 and flows over the end surface 14 of the submount 10, the potential of the first electrode 16 and the potential of a base material 11 might become the same as each other. Due to such a situation, an unintended potential difference between another electrode such as a second electrode 17 and the base material 11 might be caused, leading to a characteristic defect of a device.

On the other hand, according to the present embodiment, the fourth groove 60 is formed at the above-described position, and the insulating layer 15 is formed on the end surface 14 of the submount 10 exposed due to formation of the fourth groove 60. Thus, conduction between the protruding conductive adhesive and the base material 11 can be prevented, and favorable characteristics and reliability of the device can be maintained. Moreover, the fourth grooves 60 can be formed at the same time as formation of dummy patterns 30 at the pattern formation step illustrated in FIG. 5. Thus, an increase in the number of steps can be prevented, and an increase in the cost for manufacturing the submount 10 can be suppressed. Similarly, the insulating layer 15 can be formed in the fourth groove 60 at the insulating layer formation step illustrated in FIG. 5. Thus, an increase in the number of steps can be prevented, and an increase in the cost for manufacturing the submount 10 can be suppressed.

Note that FIG. 10 illustrates the example where the substrate 100 is divided substantially at the center of the fourth groove 60 in the X-direction, but for example, the substrate 100 may be divided along each of the opposing side surfaces of the fourth groove 60. With this configuration, formation of a corner portion at the end surface 14 of the submount 10 can be prevented, and cracking or chipping of the submount 10 due to, e.g., stress on the corner portion can be reduced. For ensuring the strength of the submount 10, the length of the fourth groove 60 in the Y-direction is preferably equal to or smaller than the half of the length of the submount 10 in the Y-direction.

Other Embodiments

At the insulating layer formation step illustrated in FIG. 5, a silicon oxide film as the insulating layer 15 may be formed on the surface of the substrate 100 by means of other methods such as a chemical vapor deposition (CVD) method. In this case, an insulating layer other than the silicon oxide film, such as a silicon oxynitride film, may be formed. The type of insulating layer 15 to be formed may be changed as necessary. Other vapor deposition methods may be applied at the coating formation step illustrated in FIG. 5. For example, normal oblique vapor deposition or ion beam deposition may be used. As long as a predetermined value or greater of the thickness of the metal film 40 deposited on the side surface 13 of the submount 10 can be ensured, a normal sputtering or vapor deposition method may be used. Upon division of the substrate 100, the substrate 100 may be divided into pieces by a method other than stealth dicing, such as normal dicing using a blade.

The substrate 100 may be other materials such as resin, ceramics, or glass. In the case of using a so-called insulating substrate made of an insulating material, the insulating layer formation step illustrated in FIG. 5 is omitted. Note that a well-known silicon substrate is used for performing processing by a semiconductor manufacturing process, and therefore, the accuracy of processing of each pattern formed on the submount 10 can be significantly improved. For example, the light passing ports 21, 22 can be formed with favorable dimensional accuracy. The alignment mark (not shown) for alignment with a photomask or the stencil mask for the processing can be formed on the substrate 100 with favorable dimensional accuracy, and therefore, the accuracy of alignment with various masks can be improved. With this configuration, the accuracy of arrangement of each electrode and the dimensional accuracy can be improved, and occurrence of short circuit and leakage between the electrodes can be prevented, for example.

Figure 11:
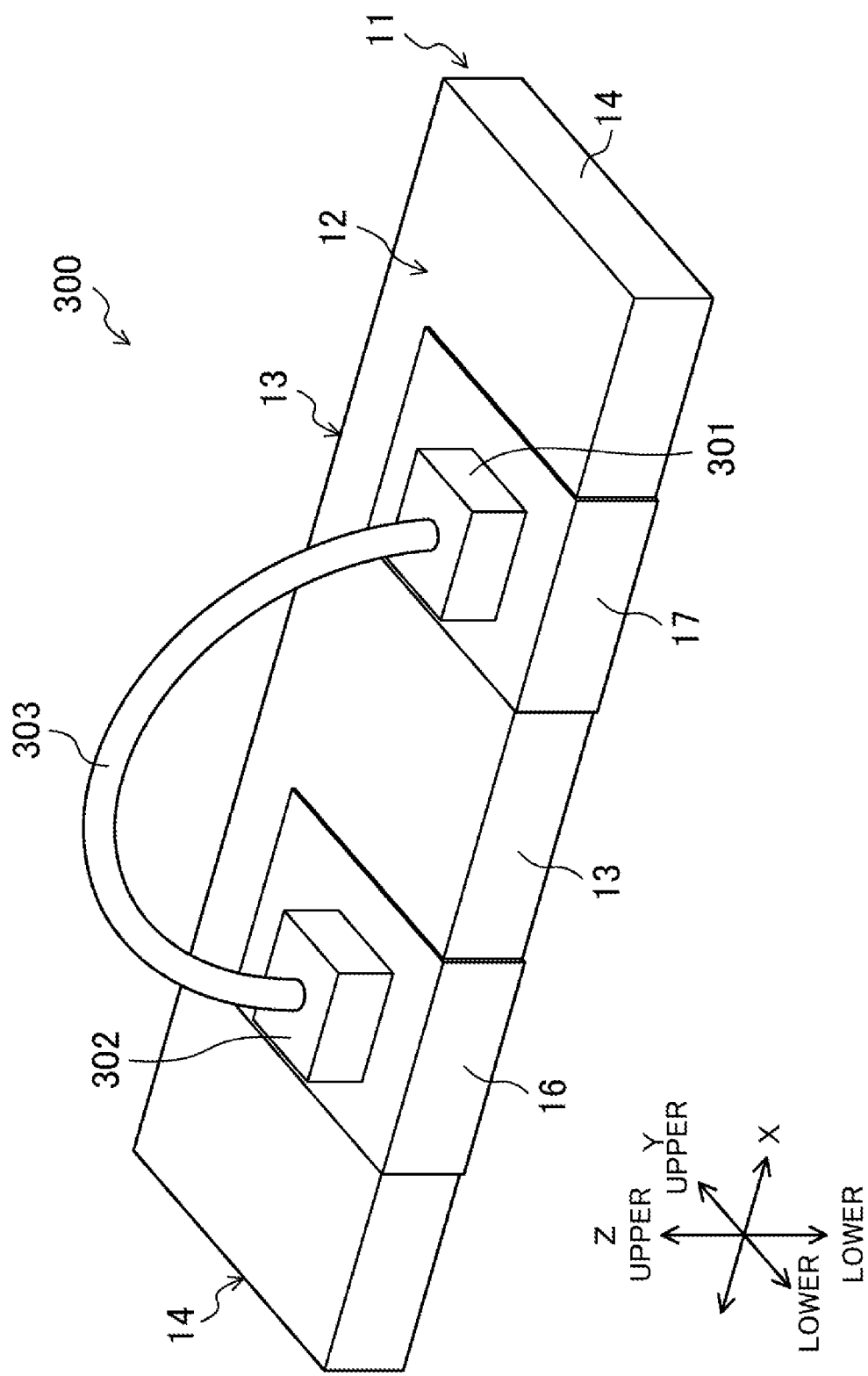
FIG. 11 illustrates a perspective view of an electronic component module.

Note that in the above-described first to third embodiments, the submount 10 used for the shutter apparatus has been described as an example, but needless to say, the present invention is also applicable to use other than above. For example, as illustrated in FIG. 11, the present invention may be applied to a high-frequency module 300 having a noise filter 301 and a high-frequency diode 302. In this example, the noise filter 301 and the high-frequency diode 302 are connected to each other through a metal wire 303. However, the noise filter 301 and the high-frequency diode 302 may be connected to each other through the electrodes formed on the upper surface 12 of the submount 10, and may be each connected to two electrodes 16, 17 formed continuously from the upper surface 12 to the side surface 13 and provided separately from each other.

The components described in the above-described variation and each of the above-described embodiments may be combined to form a new embodiment. For example, the fourth groove 60 illustrated in FIG. 10 may be formed at the corresponding position of the substrate 100 illustrated in FIG. 8. With this configuration, short circuit and leakage between the electrodes can be prevented, and short circuit or leakage between the base material 11 and the first electrode 16, the second electrode 17, or the third electrode 18 can be prevented. Thus, the characteristic defect of the device mounted on the submount 10 can be reduced, and the reliability can be improved.

The substrate processing method of the present invention can form the coatings separated from each other on the side surface of the body portion, and is useful in application to manufacturing of an electronic substrate such as a submount having an electrode formed continuously from an upper surface to a lower surface, for example.

The invention claimed is:

1. A substrate processing method, the method comprising:
   a substrate preparation step of preparing a substrate having an upper surface and a lower surface;
   a first pattern formation step of forming a dummy pattern extending in a first direction on the substrate and having a protrusion;
   a second pattern formation step of forming a first groove and a second groove each extending in the first direction on the substrate;
   a mask arrangement step of arranging a stencil mask having multiple opening patterns on the substrate;
   a coating formation step of forming a coating on the substrate through the multiple opening patterns; and
   a separation step of separating the dummy pattern from the substrate to divide the substrate into pieces and obtain a divided part of the substrate as a body portion, wherein:
   in the second pattern formation step, the first groove and the second groove each penetrate the substrate in a third direction as a thickness direction of the substrate, and the first groove and the second groove are formed such that a surface to be a side surface of the body portion is exposed,
   after the first pattern formation step and before the separation step, the protrusion protrudes from a side surface of the dummy pattern and is formed with a predetermined clearance relative to the surface to be the side surface of the body portion, and viewed from the third direction, a part of the side surface of the dummy pattern other than the protrusion is positioned a distance away from the surface to be the side surface of the body portion that is greater than the predetermined clearance.

2. The substrate processing method according to claim 1, wherein the stencil mask covers at least the predetermined clearance.

3. The substrate processing method according to claim 2, wherein the stencil mask continuously covers at least the protrusion, the predetermined clearance, and the body portion facing the protrusion.

4. The substrate processing method according to claim 1, wherein, after execution of the first pattern formation step and before execution of the separation step, the dummy pattern is connected to the substrate only on an end side of a part to be the body portion.

5. The substrate processing method according to claim 1, wherein, at the coating formation step, a first coated region and a second coated region are formed on the surface to be the side surface of the body portion facing the protrusion, wherein the first and second coated region are separated by an interval along the first direction.

6. The substrate processing method according to claim 5, wherein, at the coating formation step:
   a third coated region and a fourth coated region are formed on a surface to be an upper surface of the body portion,
   the third coated region is formed continuously to the first coated region formed on the surface to be the side surface of the body portion and extends in a second direction crossing the first direction, and
   the fourth coated region is formed continuously to the second coated region formed on the surface to be the side surface of the body portion and extends in the second direction.

7. The substrate processing method according to claim 5, wherein, at the second pattern formation step, a third groove is formed at least between a first coating preformation region and a second coating preformation region or between the first coating preformation region and a surface to be an end surface of the body portion, the first coating preformation region being a region where the first coated region is to be formed, and the second coating preformation region being a region where the second coated region is to be formed.

8. The substrate processing method according to claim 7, wherein:
   at the second pattern formation step, a fourth groove is formed such that the surface to be the end surface of the body portion formed continuously to the surface to be the side surface is exposed, and
   an insulating layer formation step of forming an insulating layer on the surface to be the end surface of the body portion is further provided after the second pattern formation step.

* * * * *